United States Patent
Chang et al.

(10) Patent No.: US 9,257,304 B2
(45) Date of Patent: Feb. 9, 2016

(54) METHOD OF MANUFACTURING NON-VOLATILE MEMORY DEVICE

(71) Applicant: Magnachip Semiconductor, Ltd., Cheongju-si (KR)

(72) Inventors: Yunseong Chang, Cheongju-si (KR); Yangbeom Kang, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/523,183

(22) Filed: Oct. 24, 2014

(65) Prior Publication Data

US 2015/0235868 A1   Aug. 20, 2015

(30) Foreign Application Priority Data

Feb. 17, 2014   (KR) .................. 10-2014-0017762

(51) Int. Cl.
| | |
|---|---|
| H01L 21/3205 | (2006.01) |
| H01L 21/4763 | (2006.01) |
| H01L 21/3213 | (2006.01) |
| H01L 21/28 | (2006.01) |
| H01L 21/02 | (2006.01) |
| H01L 21/311 | (2006.01) |
| H01L 27/115 | (2006.01) |
| H01L 29/423 | (2006.01) |
| H01L 29/788 | (2006.01) |

(52) U.S. Cl.
CPC .... H01L 21/32139 (2013.01); H01L 21/02164 (2013.01); H01L 21/28273 (2013.01); H01L 21/31144 (2013.01); H01L 27/11521 (2013.01); H01L 27/11541 (2013.01); H01L 29/42328 (2013.01); H01L 29/42324 (2013.01); H01L 29/788 (2013.01)

(58) Field of Classification Search
CPC ............ H01L 27/11521; H01L 29/288; H01L 29/42324; H01L 29/42328
USPC ................................ 438/257–267, 585–596
See application file for complete search history.

(56) References Cited

U.S. PATENT DOCUMENTS

| | | | |
|---|---|---|---|
| 8,569,173 B2 | 10/2013 | Li et al. | |
| 2010/0038692 A1* | 2/2010 | Chuang et al. | 257/298 |
| 2014/0227843 A1* | 8/2014 | Tsukamoto et al. | 438/275 |

* cited by examiner

*Primary Examiner* — Karen Kusumakar
(74) *Attorney, Agent, or Firm* — NSIP Law

(57) ABSTRACT

A method for manufacturing a non-volatile memory includes depositing a first conductive film and a protective film on a substrate including a logic area and a cell area, patterning the protective film, depositing a hard mask layer on the first conductive film and the patterned protective film to pattern the hard mask layer, using the patterned hard mask layer to form a logic gate on the logic area, exposing a surface of the first conductive film in the cell area and forming a control gate on the cell area.

17 Claims, 10 Drawing Sheets

METHOD OF MANUFACTURING NON-VOLATILE MEMORY DEVICE

CROSS-REFERENCE TO RELATED APPLICATIONS

This application claims the benefit under 35 USC §119(a) of Korean Patent Application No. 10-2014-0017762 filed on Feb. 17, 2014, in the Korean Intellectual Property Office, the entire disclosure of which is incorporated herein by reference for all purposes.

BACKGROUND

1. Field

The following description relates to a method for manufacturing a non-volatile memory device forming a control gate and a logic gate in the non-volatile memory device.

2. Description of Related Art

A conventional method for protecting elevated poly-silicon structures during etching processes is a technology forming a protective mask layer by protecting the corresponding poly-silicon structure. The corresponding protective mask layer may use a silicon dioxide, an amorphous carbon or a photo resist.

However, in such a prior art, a control gate is located on an upper portion of a floating gate so that the control gate is easily damaged in an etching process for generating a logic gate. Also, a cell area is protected by a single protective mask layer in a logic gate forming process not to effectively protect the control gate and the floating gate.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a method of manufacturing the non-volatile memory device forming a control gate and a logic gate having a step (differential height/thickness) by a hard mask and a photo resist.

In another general aspect, there is provided a method of manufacturing the non-volatile memory device forming the control gate after forming the logic gate.

In another general aspect, there is provided a method of manufacturing the non-volatile memory device that the control gate is located beside the floating gate.

In another general aspect, there is provided a method of manufacturing a non-volatile memory device includes providing a substrate comprising a logic area and a cell area, forming a floating gate on the cell area, depositing a first conductive film and a protective film on the substrate, patterning the protective film, depositing a hard mask layer on the first conductive film and the patterned protective film, patterning the hard mask layer, forming a logic gate on the logic area using the patterned hard mask layer, exposing a surface of the first conductive film in the cell area, and forming a control gate on the cell area.

The patterning of the protective film may include forming a first mask pattern on an upper portion of the floating gate, and removing the protective film exposed by the first mask pattern, the first mask pattern corresponding to an etching mask.

The patterning of the hard mask layer may include forming a second mask pattern for etching the hard mask layer, patterning the hard mask layer by the second mask pattern, the second mask pattern corresponding to the etching mask, removing the first mask pattern, and forming a third mask pattern on an upper portion of the floating gate.

The exposing of the surface of the first conductive film in the cell area may include forming a fourth mask pattern exposing the hard mask layer in the upper portion of the floating gate, and sequentially etching the hard mask layer and the protective layer of the upper portion of the floating gate.

A height of the control gate may be greater than that of the logic gate.

The control gate may be located beside the floating gate.

The protective film may be of silicon oxide.

A thickness of the protective film may be greater than or equal to about 1000 Å and less than or equal to about 2000 Å.

The hard mask layer may include silicon oxide and silicon oxynitride (SiON).

A step between the cell area and the logic area may be at least about 500 nm.

The first conductive film may be deposited before the protective film.

In another general aspect, there is provided a method of manufacturing a non-volatile memory device, including forming a floating gate on a semiconductor substrate, depositing a gate insulator, a first conductive film and a protective film on the floating gate, patterning the protective film, depositing a hard mask layer on the patterned protective film, removing the hard mask layer and the patterned protective film to expose a surface of the first conductive film, etching back the first conductive film, and forming a control gate beside the floating gate.

The removing of the hard mask layer and the patterned protective film may include forming a third mask pattern to expose the hard mask layer, and wet etching the hard mask layer and the patterned protective film.

The control gate may be higher than the logic gate.

The protective film may be silicon oxide.

The hard mask layer may be silicon oxide and silicon oxynitride (SiON).

The gate insulator may be deposited before the first conductive film, and the first conductive film may be deposited before the protective film.

Other features and aspects will be apparent from the following detailed description, the drawings, and the claims.

Figure 1:
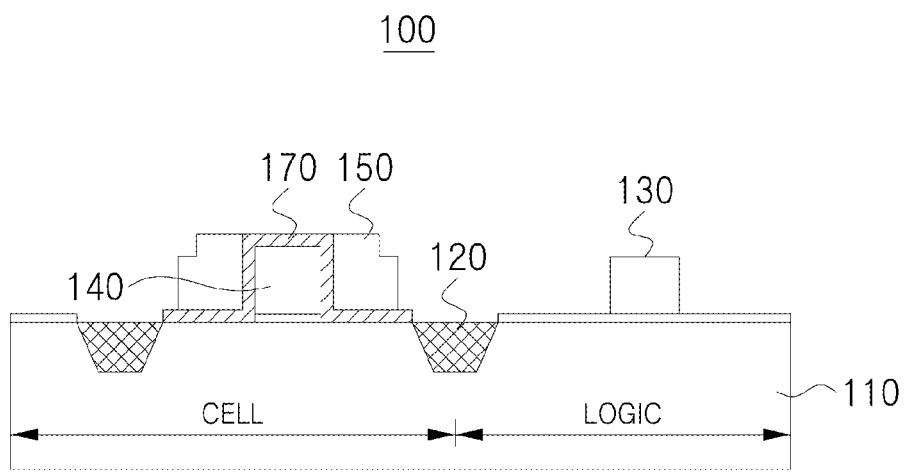
FIG. 1 is a diagram illustrating an example of a non-volatile memory device.

Throughout the drawings and the detailed description, unless otherwise described, the same drawing reference numerals will be understood to refer to the same elements, features, and structures. The relative size and depiction of these elements may be exaggerated for clarity, illustration, and convenience

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

While terms such as "first" and "second," etc., may be used to describe various components, such components must not be understood as being limited to the above terms. The above terms are used only to distinguish one component from another. For example, a first component may be referred to as a second component without departing from the scope of the present disclosure, and likewise a second component may be referred to as a first component.

It will be understood that when an element is referred to as being "connected to" another element, it can be directly connected to the other element or intervening elements may also be present. In contrast, when an element is referred to as being "directly connected to" another element, no intervening elements are present. In addition, unless explicitly described to the contrary, the word "comprise" and variations such as "comprises" or "comprising," will be understood to imply the inclusion of stated elements but not the exclusion of any other elements. Meanwhile, other expressions describing relationships between components such as "~between", "immediately~between" or "adjacent to~" and "directly adjacent to~" may be construed similarly.

Singular forms "a", "an" and "the" in the present disclosure are intended to include the plural forms as well, unless the context clearly indicates otherwise. It will be further understood that terms such as "including" or "having," etc., are intended to indicate the existence of the features, numbers, calculations, actions, components, parts, or combinations thereof disclosed in the specification, and are not intended to preclude the possibility that one or more other features, numbers, calculation s, actions, components, parts, or combinations thereof may exist or may be added.

FIG. 1 is a diagram illustrating an example of a non-volatile memory device. Referring to FIG. 1, a non-volatile memory device 100 includes a substrate 110, an insulator 120, a logic gate 130, a floating gate 140, a control gate 150, and a dielectric layer 170.

The substrate 110 may divide into a logic area 111 and a cell area 112. The logic area 111 may include the logic gate 130 and the cell area 112 may include the floating gate 140 and the control gate 150.

The insulator 120 is an isolation area corresponding to a deactivation area in an active area.

The logic gate 130 is located on an upper portion of the logic area 111 and is formed by material, such as, for example, poly-silicon.

The floating gate 140 is formed on an upper portion of the cell area 112 and is enclosed by the control gate 150. In one example, the floating gate 140 may be located below the control gate 150.

The control gate 150 is formed on the upper portion of the cell area 112 and encloses the floating gate 140. The control gate 150 may have a height that is different from a height of the logic gate 130. The control gate 150 may be formed higher than the logic gate 130. When a step between the control gate 150 and the logic gate 130 exists, a thickness of a photo resist being applied to a corresponding step may be different and the upper portion of the floating gate 140 may be damaged because of difference of the corresponding thickness in an etching process for forming the logic gate 130.

Therefore, a separate process is required in order to prevent the damage of the floating gate 140 in the etching process. A protecting procedure of the floating gate 140 will be described below.

The dielectric layer 170 may be formed of a high dielectric oxide. When the high dielectric oxide is used, a capacitance and a coupling efficiency may be increased.

FIG. 2 through FIG. 9 are diagrams illustrating examples of a manufacturing process of a non-volatile memory device by using a protective film.

Figure 2:
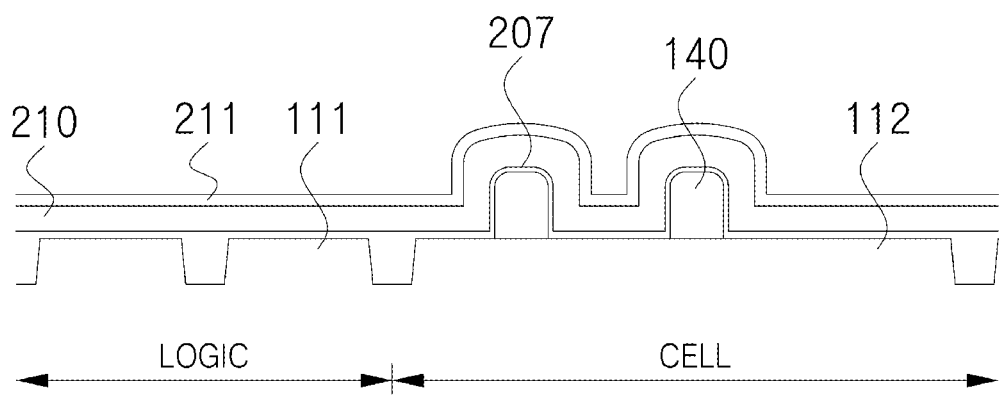
FIG. 2 through FIG. 9 are diagrams illustrating examples of manufacturing processes of a non-volatile memory device by using a protective film.

In FIG. 2, the substrate 110 is divided into the logic area 111 and the cell area 112. A tunneling gate insulator formed with at least one or a stack of a silicon oxide, a silicon nitride (SiN) and a silicon oxynitride (SiON) is deposited on the semiconductor substrate.

A conductive film is deposited on the tunneling gate insulator (not shown). The conductive film may be formed with a single poly-silicon or a stacked metal poly-silicon. A mask pattern is formed using the photo resist (PR) (not shown) to form the floating gate 140 (not shown). The mask pattern corresponding to an etching mask etches the conductive film to form the floating gate 140 on the tunneling gate insulator (not shown). The tunneling gate insulator and the floating gate 140 are formed in the cell area, and the tunneling gate insulator and the floating gate 140 formed in the logic area are removed so that the semiconductor substrate is exposed.

The gate insulator 207 used for the control gate is deposited on the semiconductor substrate in the cell area. The gate insulator 207 used for the logic gate 130 is formed on the semiconductor substrate in the logic area. The gate insulator 207 may be formed with at least one or the stack of the silicon oxide, the silicon nitride (SiN) and the silicon oxynitride (SiON). In another example, a High-K insulator having a high dielectric constant value may be used as the gate insulator 207. The conductive film 210 is deposited on the gate insulator 207. The conductive film 210 may be used for the control gate 150 and may be formed with the single poly-silicon or the stacked metal poly-silicon. The upper portion and a side portion of the floating gate 140 are enclosed by the conductive film 210 forming the control gate 150.

The protective film 211 is deposited on the conductive film 210. The non-exhaustive examples described herein use the silicon oxide for the protective film 211, however, the protective film 211 may be formed with at least one or the stack of the silicon oxide, the silicon nitride (SiN) and the silicon oxynitride (SiON). The protective film 211 uses a TEOS (Tetra Ethyl Ortho Silicate) material and is deposited by a LPCVD (Low Pressure Chemical Vapor Deposition) procedure. The protective film 211 is stacked on an upper portion of the logic area 111 and the cell area 112. The protective film 211 is formed on the conductive film 210 to protect the conductive film 210 in the etching processes.

The protective film 211 protects the upper portion of the floating gate 140 of the cell area 112 in the etching process and is removed at a final process.

Figure 3:
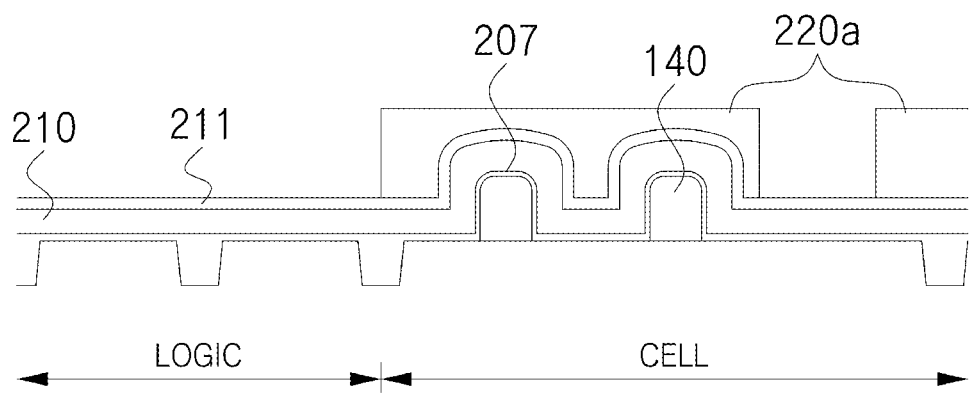

In FIG. 3, a first photo resist 220a is formed on the upper portion of the floating gate 140 in the cell area 112. The conductive film 210 and the protective film 211 are formed on the upper portion of the floating gate 140 and the conductive film 210 and the protective film 211 are used for forming the control gate 150.

Figure 4:
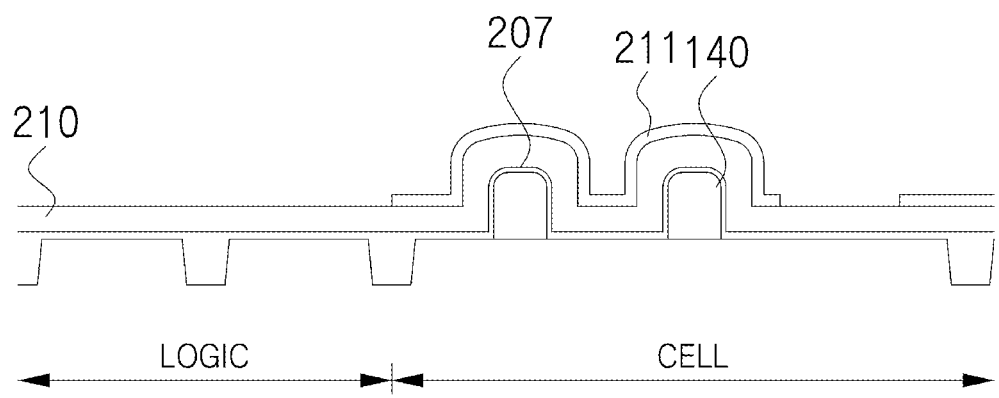

In FIG. 4, a first etching process is shown. In FIG. 4, the protective film 211 of the upper portion of the cell area 112 is protected by the first photo resist 220a. The protective film 211 of the upper portion of the logic area 111 is removed by the etching process. The protective film 211 of the upper portion of the floating gate in the cell area 112 remains after the first etching process and the protective film 211 may function to protect the control gate 150 in a later etching process for forming the logic gate 130.

Figure 5:
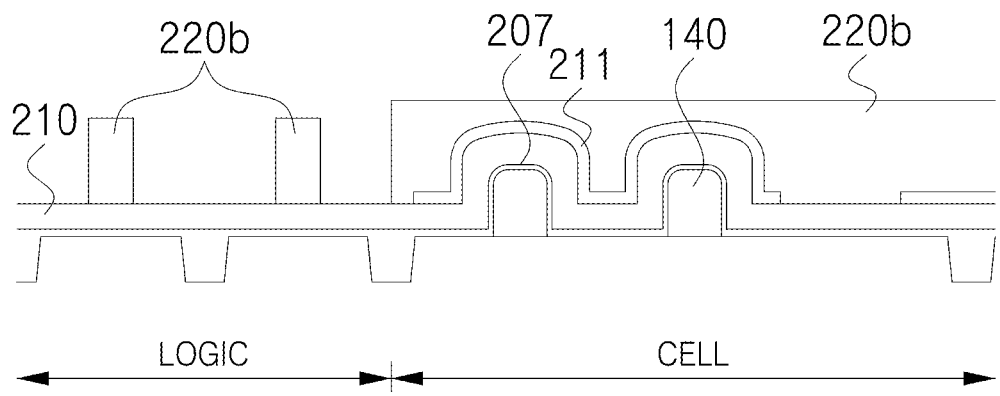

In FIG. 5, the second photo resist 220b is formed on a part of the cell area 112 and the logic area 111. The second photo resist 220b functions to protect a part of the control gate 150 and the logic gate 130 of the logic area 111 to form the logic gate 130. The logic gate 130 is formed in a lower area that is protected by the second photo resist 220b in the logic area 111.

When a step between a conductive film 210 of the logic area 111 and a conductive film 210 stacked on the floating gate 140 exists in the cell area 112, the second photo resist 220b is affected by the corresponding step. In a photo resist forming process, a thickness of the second photo resist 220b of the upper portion of the logic gate 130 may be thicker than that of the upper portion of the floating gate 140.

Figure 6:
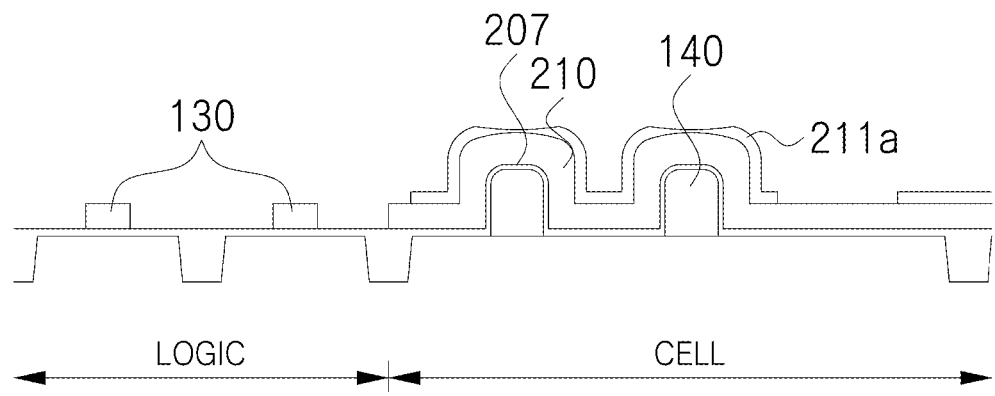

In FIG. 6, a second etching process is shown. The logic gate 130 is formed on the upper portion of the logic area 111 in the second etching progress. The protective film 211 of the upper portion of the conductive film 210 in the cell area 113 is partially removed by the second etching process. That is, a part of the protective film 211a is removed by the second etching process as described in FIG. 6.

As described above, a thickness difference of the second photo resist 220b may damage the conductive film 211 of the upper portion of the floating gate 140 while each of the etching processes is in progress. However, the conductive film 210 may be protected by the protective film 211 stacked thereon to prevent the damage of the conductive film 210 of the upper portion of the floating gate 140.

Figure 7:
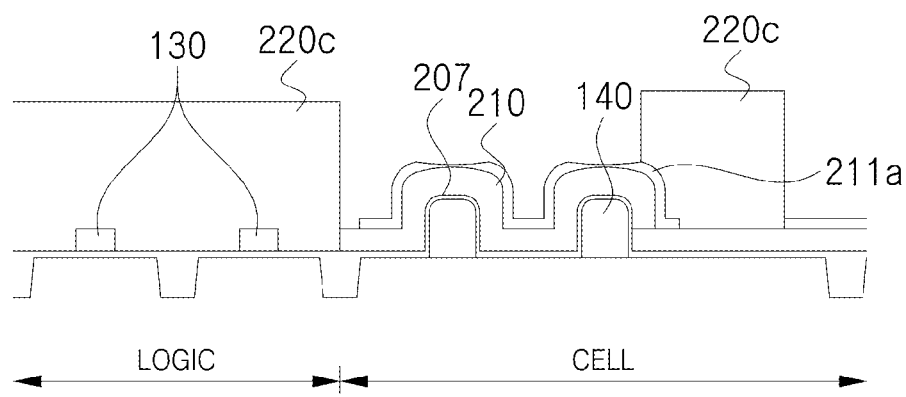

In FIG. 7, a third photo resist 220c is formed on a part of the logic area 111 and the cell area 113. The third photo resist 220c may be formed on the logic area 111 to protect the logic gate 130 and may determine a shape of the control gate 150.

Figure 8:
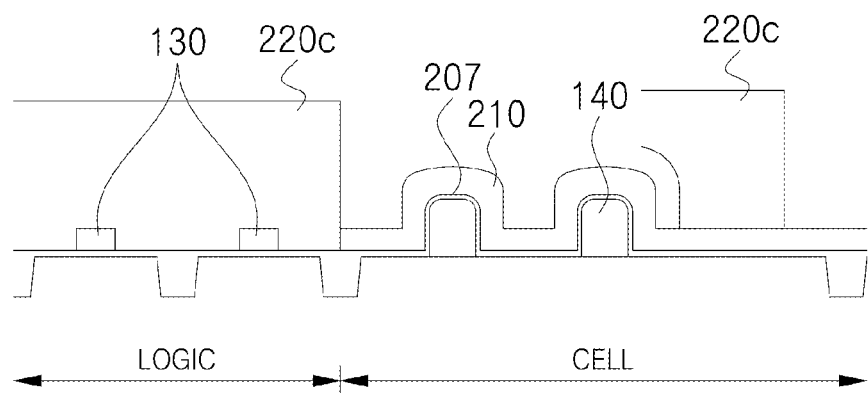

In FIG. 8, a third etching process is shown. The third etching process corresponds to a wet etching and the rest of the protective film 211a of the upper portion of the cell area 113 is completely removed by the third etching process.

Figure 9:
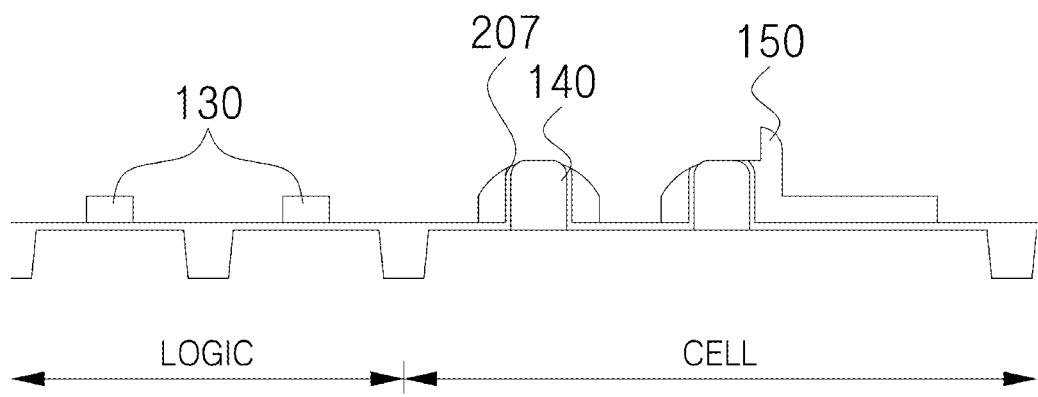

In FIG. 9, a fourth etching process is shown using the third photo resist 220c formed by the above process. During the fourth etching a part of the conductive film 210 of the upper portion of the floating gate 140 is removed by etching back as shown in FIG. 9. The conductive film 210 enclosing a side of the floating gate remains. Therefore, a shape of the control gate 150 may be determined by a shape of the third photo resist 220c.

FIG. 10 through FIG. 20 are diagrams illustrating examples of a manufacturing process of a non-volatile memory device using a protective film and a hard mask.

Figure 10:
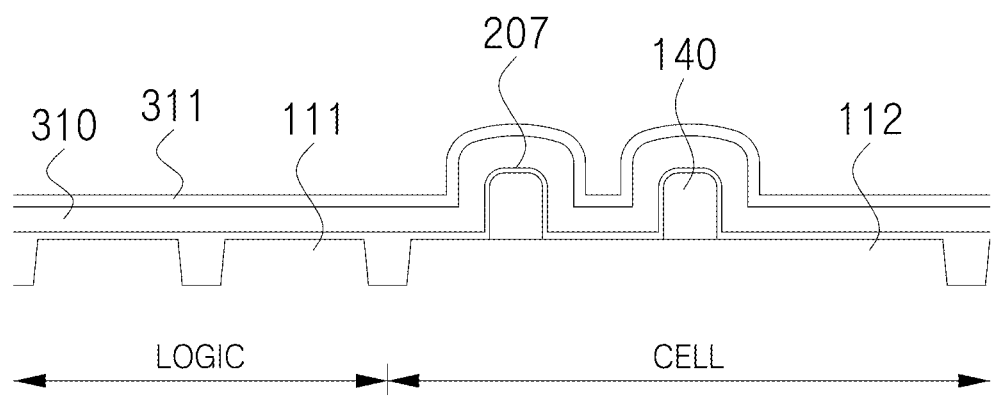
FIG. 10 through FIG. 20 are diagrams illustrating examples of manufacturing process of a non-volatile memory device using a protective film and a hard mask.

FIG. 10 illustrates a procedure of preparing a semiconductor substrate including a logic area and a cell area, forming a floating gate on the cell area, depositing a first conductive film on a front surface of the substrate, and depositing a protective film on the first conductive film.

The semiconductor substrate includes the logic area 111 and the cell area 112. A tunneling gate insulator (not shown) formed with at least one or a stack of a silicon oxide, a silicon nitride (SiN), and a silicon oxynitride (SiON) is deposited on the semiconductor substrate. The conductive film is deposited on the tunneling gate insulator (not shown). The conductive film may be formed with the single poly-silicon or the stacked metal poly-silicon. The photo resist (PR) (not shown) is used to form the floating gate 140 for the mask pattern. The conductive film is etched by the mask pattern corresponding to the etching mask to form the floating gate 140 on the tunneling gate insulator. The tunneling gate insulator and the floating gate 140 are formed in the cell area 112, and the tunneling gate insulator and the floating gate 140 formed in the logic area are removed so that the semiconductor substrate is exposed.

A gate insulator 207 used for the control gate 150 is deposited on the semiconductor substrate in the cell area. The gate insulator 207 used for the logic gate 130 is formed on the semiconductor substrate 310 in the logic area. The gate insulator 207 may be formed with at least one or a stack of the silicon oxide, the silicon nitride (SiN) and the silicon oxynitride (SiON). In another example, the High-K insulator having a high dielectric constant value may be used as the gate insulator 207.

A conductive film 310 is deposited on the gate insulator 207. The conductive film 310 may be used for the control gate 150 and may be formed with the single poly-silicon or the stacked metal poly-silicon. The upper and a side of the floating gate 140 are enclosed by the conductive film 310 forming the control gate 150.

The protective film 311 is deposited on the conductive film 310. The protective film 311 is formed with at least one or a stack of the silicon oxide, the silicon nitride (SiN) and the silicon oxynitride (SiON). The example described herein uses the silicon oxynitride (SiON) for the protective film 311, however, the present disclosure is not limited to SiON and it is understood that those skilled in the art may include other types of protective film. The protective film 311 uses the TEOS material and is deposited by the LPCVD procedure. The protective film 311 is stacked on the upper portion of the logic area 111 and the cell area 112. The protective film 311 is formed on the conductive film 310 to protect the conductive film 310 used for the control gate 150 in the etching processes. The protective film 311 protects the upper portion of the floating gate 140 of the cell area 112 in the etching process and is removed in the final process.

Figure 11:
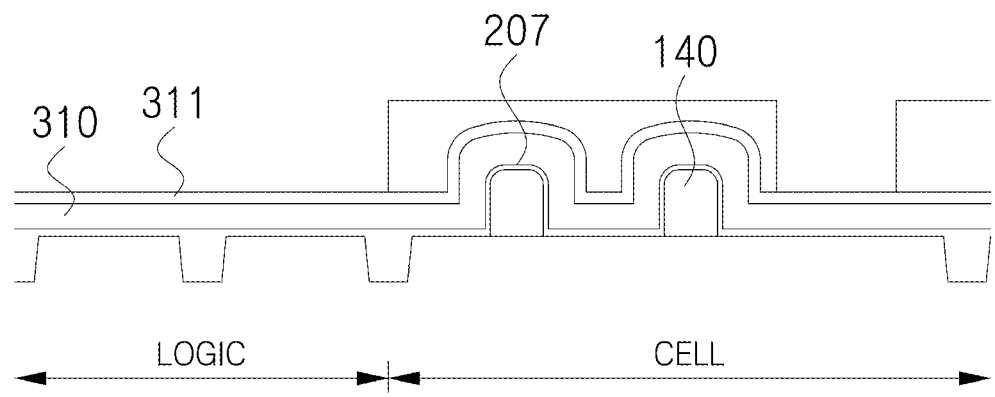
Figure 12:
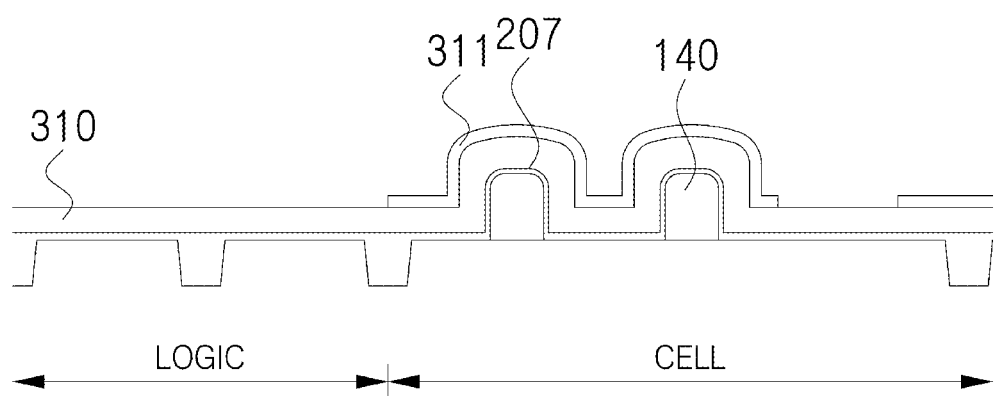

FIG. 11 and FIG. 12 illustrate procedures of patterning the protective film 311. Patterning the protective film 311 includes forming a first mask pattern on the upper portion of the floating gate 140 (FIG. 11) and removing the exposed protective film 311 by using the first mask pattern as the etching mask (FIG. 12). Between the floating gate 140 and the first mask pattern, the gate insulator 207, the conductive film 310 used for the control gate 150 and the protective film 311 are formed, so the first mask pattern 320a may be in contact with the protective film 311. As described in FIG. 12, the rest of the exposed protective film 311 except for a periphery of the floating gate 140 is removed by the etching process.

Figure 13:
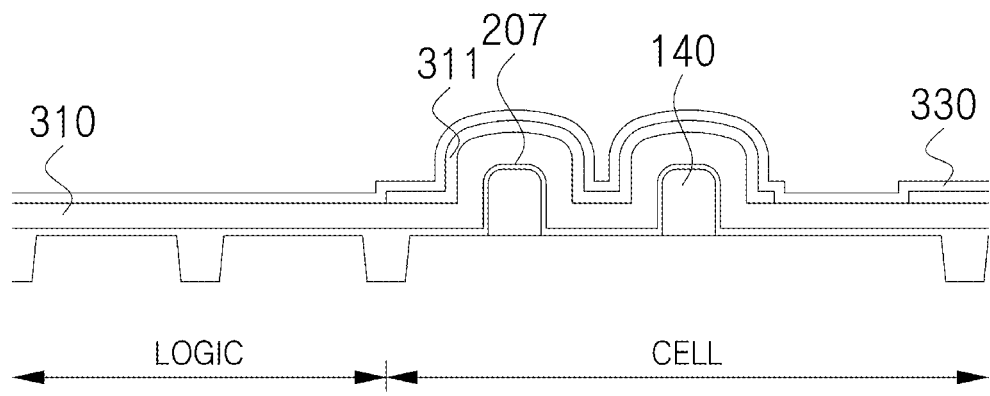

In FIG. 13, a hard mask layer 330 is deposited on the upper portion of the logic area 111 and the cell area 112. The hard mask layer 330 is formed with at least one or a stack of the silicon oxide, the silicon nitride (SiN) and the silicon oxynitride (SiON). The present example uses the silicon oxide ($SiO_2$) depositing the silicon oxynitride (SiON) or the silicon oxide ($SiO_2$) depositing the silicon nitride (SiN), however, the present disclosure is not so limited and it is understood that those skilled in the art may include other types of hard mask layers. When the etching process for forming the logic gate 130 is in progress, the hard mask layer 330 prevents damage of the conductive film 310 on the upper portion of the floating gate 140.

As described in FIG. 13, the gate insulator 207, the protective film 310 used for the control gate 150, the protective film 311 and the hard mask layer 330 are formed in the cell area 112 so a height of the cell area 112 is higher than a height of the logic area 111. This is because the floating gate structure is already formed in the cell area 112 before the conductive film 310 is formed. A height of the floating gate structure is more than or equal to at least about 500 nm, therefore, a step (differential height/thickness) between the cell area 112 and the logic area 111 after the conductive film is formed, is also more than or equal to at least about 500 nm.

Figure 14:
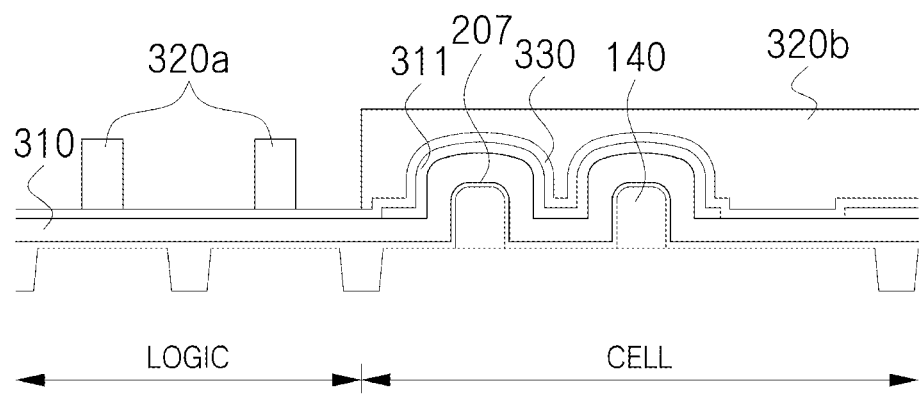
Figure 15:
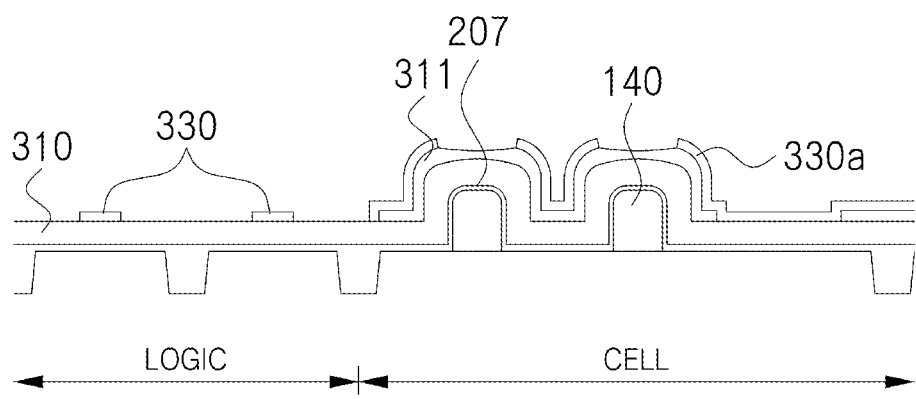
Figure 16:
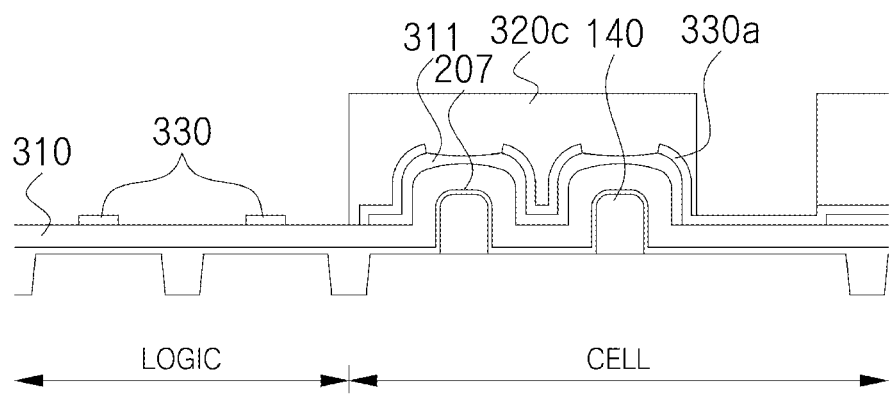

FIG. 14 through FIG. 16 illustrate examples of patterning the hard mask layer 330. Patterning the hard mask layer 330 includes forming a second mask pattern (320a, 320b) used for etching the hard mask layer 330 (FIG. 14), patterning the hard mask layer by the second mask pattern as the etching mask and removing the second mask pattern (320a, 320b) (FIG. 15) and forming a third mask pattern (320c) on the upper portion of the floating gate 140 (FIG. 16). The first and third mask patterns use a same mask pattern so that the first and third mask patterns function to protect the upper portion of the floating gate 140.

FIG. 14 illustrates an example of forming the second mask pattern (320a, 320b) used for etching the hard mask layer 330. The second photo resist 320a and 320b corresponding to the second mask pattern is formed on a part of the cell area 112 and the logic area 111. The second photo resists 320a and 320b is deposited to form the hard mask pattern. There is a step (differential height/thickness) between the conductive film 310 of the logic area 111 and the conductive film 310 stacked on the floating gate 140 of the cell area 112. This is because the gate insulator 207, the conductive film 310 used for the control gate, the protective film 311 and the hard mask layer 330 are formed in the cell area 112 as described above. A thickness difference of the second photo resists 320a and 320b is affected by the corresponding step (differential height/thickness). A second photo resist 320a stacked on an area for forming the logic gate 130 may be thicker than a thickness of the second photo resist 320b stacked on the upper portion of the floating gate 140.

FIG. 15 illustrates an example of patterning the hard mask layer 330 by the second mask pattern corresponding to the etching mask and removing the second mask pattern (320a, 320b). FIG. 15 illustrates an example of the second etching process for forming the logic gate 130. In FIG. 15, a part of the hard mask layer 330a of the upper portion of the floating gate 140 is removed by the second etching process so that the protective film 311 may be exposed. In FIG. 15 unlike FIG. 14, in spite of a thickness difference between the second photo resists 320a and 320b, the conductive film 310 of the upper portion of the floating gate 140 is not damaged by the second etching process. This is because the conductive film 310 of the upper portion of the floating gate 140 is protected by the hard mask layer 330 and the protective film 311. The hard mask layer 330 remains in an area for forming the logic gate 130 after the second etching process. The rest of the hard mask layer 330 may function as a mask for forming the logic gate 130 in the following etching process.

FIG. 16 illustrates an example of forming a third mask pattern (320c) on the upper portion of the floating gate 140. A third photo resist 320c representing the third mask pattern is formed on the cell area 112 to protect the cell area 112 from the third etching process.

Figure 17:
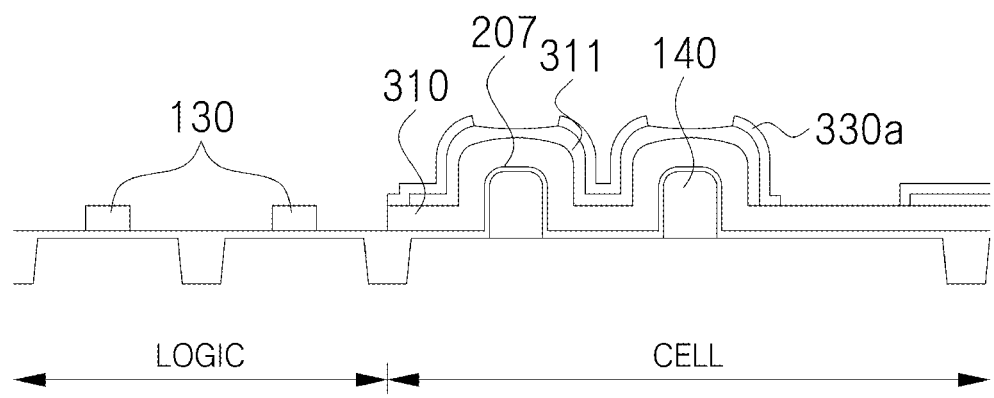

FIG. 17 illustrates an example of the third etching process. The logic gate 130 is formed by etching the conductive film 310 through the patterned hard mask layer 330 corresponding to the etching mask. A part of the conductive film 310 of the logic area 111 is removed by the third etching process. The logic gate 130 is formed by the conductive film 310 being protected by the hard mask layer 330 and the rest of the conductive layer that is not protected by the hard mask layer 330 is removed.

Figure 18:
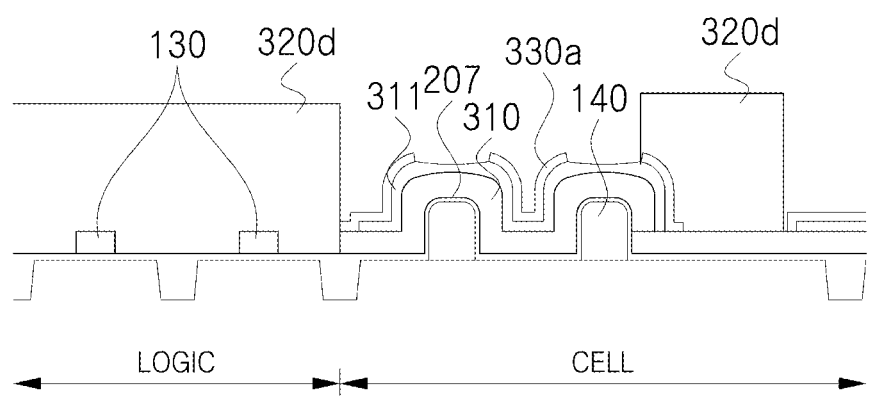
Figure 19:
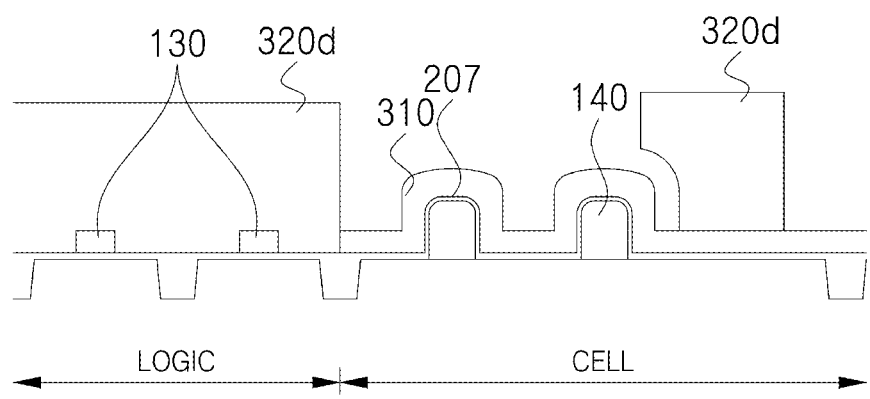

FIG. 18 and FIG. 19 are diagrams illustrating an example of exposing a surface of the conductive film 310 used for the control gate 150 of the cell area 112. FIG. 18 illustrates an example of forming a fourth mask pattern (320d) exposing the hard mask layer 330 of the upper portion of the floating gate 140 and FIG. 19 illustrates an example of substantially etching the hard mask layer 330 and the protective film 311 on the upper portion of the floating gate 140.

In FIG. 18, a fourth photo resist 320d corresponding to a fourth mask pattern is formed on a part of the logic area 111 and the cell area 112. The fourth photo resist 320d may protect the logic gate 130 formed on the logic area 111 and may open the control gate 150 being formed on the cell area 112.

In FIG. 19 illustrates an example of a fourth etching process. In FIG. 19, the hard mask layer 330a and the protective film 311 partially remaining on the upper portion of the floating gate 140 are removed by the fourth etching process. The fourth etching process is in progress by wet etching.

Figure 20:
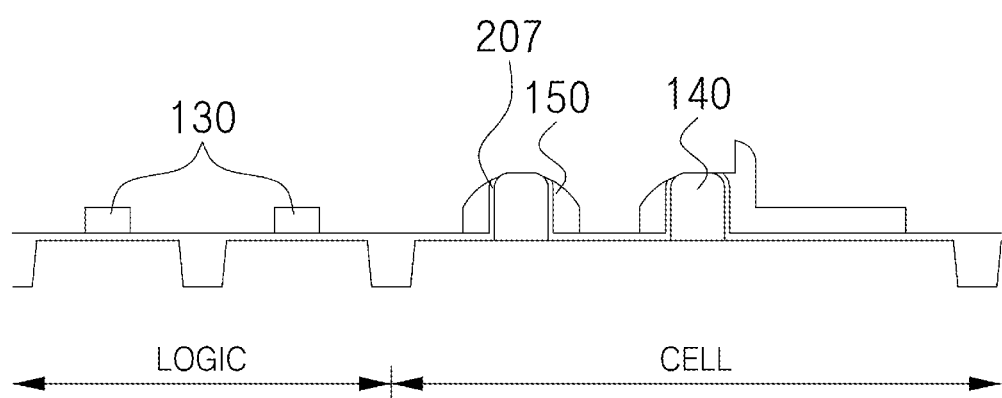

FIG. 20 is illustrates an example of forming the control gate 150. An example of the fifth etching process is shown in FIG. 20. A part of the conductive film 310 of the upper portion of the cell area 113 is removed by the fifth etching process. The control gate 150 is formed by the conductive film 310 remaining on the upper portion of the cell area 113 after etching. The fifth etching process is in progress by etching back process. The control gate 150 is formed beside the floating gate 140 being spacer shaped by the etching back process. An insulator is formed between the floating gate 140 and the control gate 150. A conductive film 310 used for the floating gate 140 may be same as the conductive film used for the control gate 150.

An electrode of the logic gate 130 is formed on the gate insulator 207 in the logic area 111. In the cell area 112, the floating gate 140 is formed on the tunneling gate insulator, the control gate 150 is formed beside the floating gate 140 and the insulator is formed between the floating gate 140 and the control gate 150. The conductive film 310 used for the floating gate 140 may be same with the conductive film 310 used to the control gate 150.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

DESCRIPTION OF SYMBOLS

100: NON-VOLATILE MEMORY DEVICE
110: SUBSTRATE
111: LOGIC AREA
112: CELL AREA
120: INSULATOR
130: LOGIC GATE
140: FLOATING GATE
150: CONTROL GATE
160: PROTECTIVE LAYER
170: DIELECTRIC LAYER
210 AND 310: CONDUCTIVE FILM
211 AND 311: PROTECTIVE FILM
220 AND 320: PHOTO RESIST

What is claimed is:

1. A method of manufacturing a non-volatile memory device, comprising:
    providing a substrate comprising a logic area and a cell area;
    forming a floating gate on the cell area;
    depositing a first conductive film and a protective film on the substrate;
    patterning the protective film;
    depositing a hard mask layer on the first conductive film and the patterned protective film;
    patterning the hard mask layer;
    forming a logic gate on the logic area using the patterned hard mask layer;
    exposing a surface of the first conductive film in the cell area; and
    forming a control gate on the cell area.

2. The method of manufacturing of claim 1, wherein the patterning of the protective film comprises:
    forming a first mask pattern on an upper portion of the floating gate; and
    removing the protective film exposed by the first mask pattern, the first mask pattern corresponding to an etching mask.

3. The method of manufacturing of claim 2, wherein the patterning of the hard mask layer comprises:
    forming a second mask pattern for etching the hard mask layer;
    patterning the hard mask layer by the second mask pattern, the second mask pattern corresponding to the etching mask;
    removing the second mask pattern; and
    forming a third mask pattern on an upper portion of the floating gate.

4. The method of manufacturing of claim 1, wherein the exposing of the surface of the first conductive film in the cell area comprises:
    forming a fourth mask pattern exposing the hard mask layer in the upper portion of the floating gate; and
    sequentially etching the hard mask layer and the protective layer of the upper portion of the floating gate.

5. The method of manufacturing of claim 1, wherein a height of the control gate is greater than that of the logic gate.

6. The method of manufacturing of claim 1, wherein the control gate is located beside the floating gate.

7. The method of manufacturing of claim 1, wherein the protective film comprises of silicon oxide.

8. The method of manufacturing of claim 1, wherein a thickness of the protective film is greater than or equal to about 1000Å and less than or equal to about 2000 Å.

9. The method of manufacturing of claim 1, wherein the hard mask layer comprises silicon oxide and silicon oxynitride (SiON).

10. The method of manufacturing of claim 1, wherein the method is applied when a step between the cell area and the logic area is at least about 500 nm.

11. The method of manufacturing of claim 1, wherein the first conductive film is deposited before the protective film.

12. A method of manufacturing a non-volatile memory device, comprising:
    forming a floating gate on a semiconductor substrate;
    depositing a gate insulator, a first conductive film and a protective film on the floating gate;
    patterning the protective film;
    depositing a hard mask layer on the patterned protective film;
    removing the hard mask layer and the patterned protective film to expose a surface of the first conductive film;
    etching back the first conductive film; and
    forming a control gate beside the floating gate.

13. The method of manufacturing of claim 12, wherein the removing of the hard mask layer and the patterned protective film comprises:
    forming a third mask pattern to expose the hard mask layer; and
    wet etching the hard mask layer and the patterned protective film.

14. The method of manufacturing of claim 12, wherein the control gate is higher than the logic gate.

15. The method of manufacturing of claim 12, wherein the protective film comprises silicon oxide.

16. The method of manufacturing of claim 12, wherein the hard mask layer comprises silicon oxide and silicon oxynitride (SiON).

17. The method of manufacturing of claim 12, wherein the gate insulator is deposited before the first conductive film, and the first conductive film is deposited before the protective film.

* * * * *